(12) United States Patent
Chen et al.

(10) Patent No.: US 9,238,317 B2
(45) Date of Patent: Jan. 19, 2016

(54) LIGHTING APPARATUS, LED MOUNTING SUBSTRATE AND MOLD FOR MANUFACTURING THE SAME

(71) Applicant: Lextar Electronics Corporation, Hsinchu (TW)

(72) Inventors: Shing-Kuo Chen, Taipei (TW); Bo-Yu Ko, New Taipei (TW); Hsiu-Hsiang Lin, Hsinchu County (TW)

(73) Assignee: Lextar Electronics Corporation, Hsinchu (TW)

( * ) Notice: Subject to any disclaimer, the term of this patent is extended or adjusted under 35 U.S.C. 154(b) by 80 days.

(21) Appl. No.: 14/156,583

(22) Filed: Jan. 16, 2014

(65) Prior Publication Data
US 2014/0197446 A1    Jul. 17, 2014

(30) Foreign Application Priority Data
Jan. 17, 2013  (TW) .............................. 102101775 A

(51) Int. Cl.
*B29C 45/02*    (2006.01)
*H01L 33/48*    (2010.01)
*H01L 33/62*    (2010.01)
*B29C 45/14*    (2006.01)
*H01L 33/60*    (2010.01)

(52) U.S. Cl.
CPC ........... *B29C 45/02* (2013.01); *B29C 45/14655* (2013.01); *H01L 33/483* (2013.01); *H01L 33/486* (2013.01); *H01L 33/62* (2013.01); *H01L 33/60* (2013.01); *H01L 2224/48091* (2013.01); *H01L 2224/48247* (2013.01)

(58) Field of Classification Search
CPC ...... H01L 33/483; H01L 33/486; H01L 33/62
See application file for complete search history.

(56) References Cited

U.S. PATENT DOCUMENTS

| 2008/0157113 | A1 | 7/2008 | Hayashi | |
| 2008/0277685 | A1* | 11/2008 | Kim et al. | 257/99 |
| 2009/0289275 | A1* | 11/2009 | Hayashi | 257/99 |

FOREIGN PATENT DOCUMENTS

| CN | 101507004 B | 4/2011 |
| TW | 200927824 A | 7/2009 |
| TW | 201131818 A | 9/2011 |

* cited by examiner

*Primary Examiner* — Thao X Le
*Assistant Examiner* — Xia L Cross
(74) *Attorney, Agent, or Firm* — Hayes Soloway PC

(57) ABSTRACT

An LED mounting substrate includes a lead frame, a base, and a residue of injection molding material. The base is placed on the lead frame, and includes a cavity. The bottom of the cavity includes an opening for exposing portion of the lead frame. The cross-sectional area of the cavity increases along the direction from the lead frame to the top surface of the base. The residue of injection molding material is remained on one of outer walls of the base surrounding the cavity. The cross-sectional area of the residue of injection molding material decreases along the direction from the lead frame to the top surface of the base.

9 Claims, 15 Drawing Sheets

LIGHTING APPARATUS, LED MOUNTING SUBSTRATE AND MOLD FOR MANUFACTURING THE SAME

RELATED APPLICATIONS

This application claims priority to Taiwan Application Serial Number 102101775, filed Jan. 17, 2013, which is herein incorporated by reference.

BACKGROUND

1. Technical Field

Embodiments of the present disclosure relate to a lighting apparatus. More particularly, embodiments of the present disclosure relate to a lighting apparatus, an LED mounting substrate and a mold for manufacturing the LED mounting substrate.

2. Description of Related Art

Because a light emitting diodes (LED) has advantages such as low power-consumption and high illumination efficiency, it has become a popular lighting device and been widely applied in illumination and backlight module.

An LED package includes a lead frame, a reflective cup and an LED chip. The LED chip is disposed on the lead frame. The reflective cup is disposed on the lead frame and surrounds the LED chip. The reflective cup is generally formed by thermoplastic material or thermosetting material. The thermosetting material forms the reflective cup by the transfer molding process. In the transfer molding process, a channel is formed on the mold, and the thermosetting material is pressed into the tank in the mold through the channel by the pressure, thereby forming the reflective cup.

Typically, only if the thermosetting material uniformly flows in the mold and two molten materials adjoin together simultaneously, the formed reflective cup exhibits higher structure strength. Because the shape of the reflective cup is complex, it is difficult for the thermosetting material to make the uniform flow and adjoin simultaneously, and the formed reflective cup may be of inadequate structure strength and easily crackable.

SUMMARY

One aspect of the present disclosure provides an LED mounting substrate having good structure strength.

In accordance with one embodiment of the present disclosure, the LED mounting substrate includes a lead frame, a base and a residue of injection molding material. The base is disposed on the lead frame and having a cavity. A bottom of the cavity has an opening for exposing a portion of the lead frame, a cross-sectional area of the cavity increases along a direction from the lead frame to a top surface of the base. The residue of injection molding material is disposed on one of outer walls of the base surrounding the cavity. A cross-sectional area of the residue of injection molding material decreases along a direction from the lead frame to the top surface of the base.

In the foregoing embodiment, because the cross-sectional area of the cavity increases upwardly, the material required for the upper portion of the base is less than the material required for the lower portion of the base. Further, because the cross-sectional area of the residue of injection molding material decreases upwardly, the cross-sectional area of the material inlet channel for injecting the material decreases upwardly, and therefore, the base and the cavity in foregoing shape can be formed by uniform material flow. Because the base is formed by uniformly flowing material, it has good structure strength.

Another aspect of the present disclosure provides a lighting apparatus having a mounting substrate with good structure strength. In accordance with one embodiment of the present disclosure, the lighting apparatus includes an LED mounting substrate and an LED chip. The LED mounting substrate is the same as described in the foregoing embodiment. The LED chip is accommodated in the cavity of the LED mounting substrate and disposed on a portion of the lead frame exposed in the cavity.

In the foregoing embodiment, because the cross-sectional area of the residue of injection molding material decreases upwardly, which is opposite to the cross sectional area of the cavity without the material, the material can uniformly flow and form a base having good structure strength.

Another aspect of the present disclosure provides a mold for manufacturing an LED mounting substrate having good structure strength. In accordance with one embodiment of the present disclosure, the mold includes a first molding die and a second molding die. The second molding die covers the first molding die. The second molding die includes a material holding tank, a pressing part and a material inlet channel. The pressing part is protruded on the material holding tank. The pressing part expands along a direction from the first molding die to the second molding die. The material inlet channel is connected between an outer wall of the second molding die and the material holding tank. The material inlet channel shrinks along a direction from the first molding die to the second molding die.

In the foregoing embodiment, because the pressing part expands upwardly, the material required for the upper portion of the material holding tank is less than the material required for the lower portion of the material holding tank. Further, because the material inlet channel shrinks upwardly, it makes the material uniformly flow in the material holding tank, so as to form the base having good structure strength.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
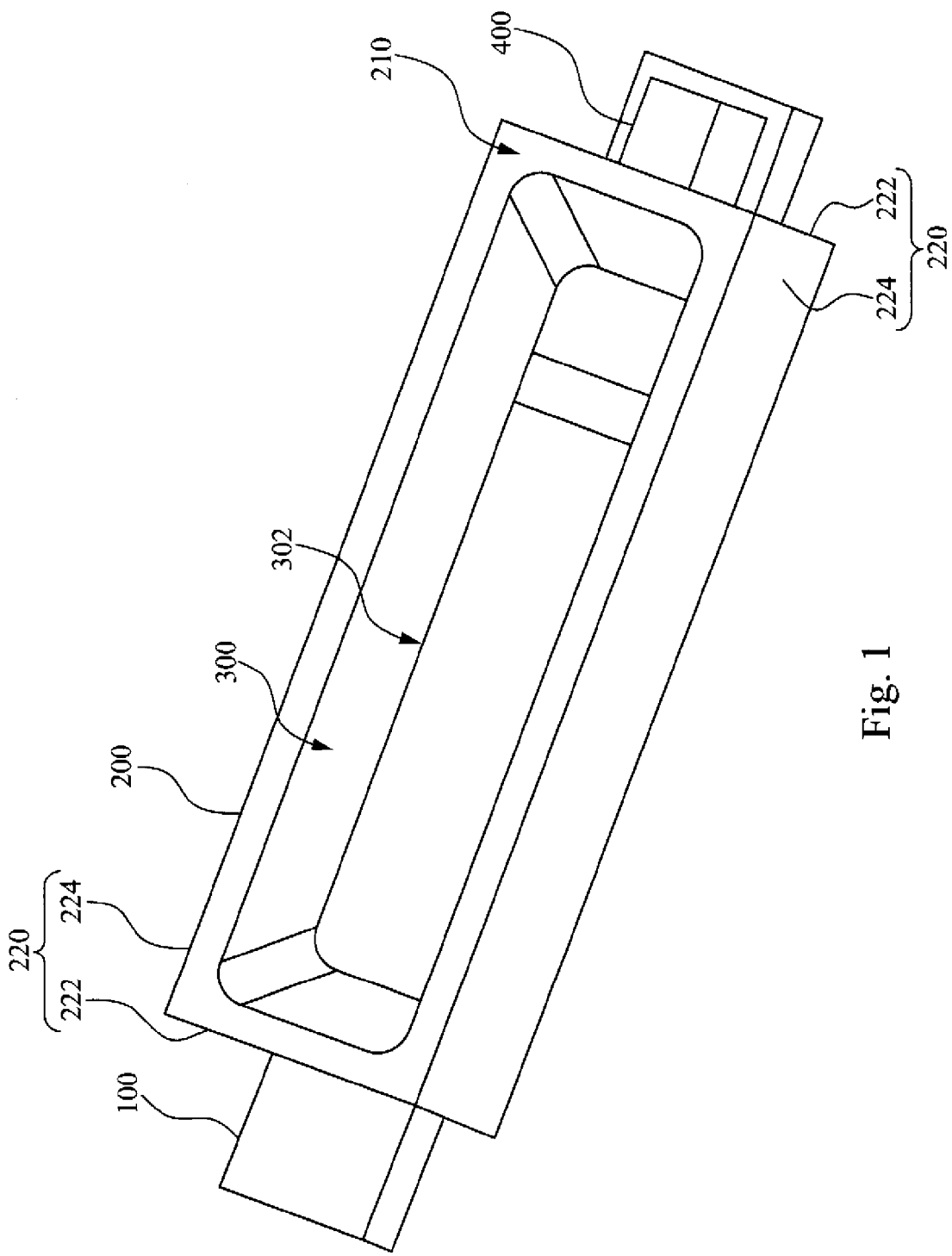
FIG. 1 is a perspective view of an LED mounting substrate in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a perspective view of an LED mounting substrate 10 in accordance with one embodiment of the present disclosure. As shown in this figure, the LED mounting substrate 10 includes a lead frame 100, a base 200 and a residue of injection molding material 400. The base 200 is disposed on the lead frame 100. The base 200 has a cavity 300. A bottom of the cavity 300 has an opening 302 for exposing a portion of the lead frame 100. A cross-sectional area of the cavity 300 increases along a direction from the lead frame 100 to a top surface 210 of the base 200. The residue of injection molding material 400 is disposed on one of outer walls 220 of the base 200 surrounding the cavity 300. A cross-sectional area of the residue of injection molding material 400 decreases along a direction from the lead frame 100 to the top surface 210 of the base 200.

Figure 2:
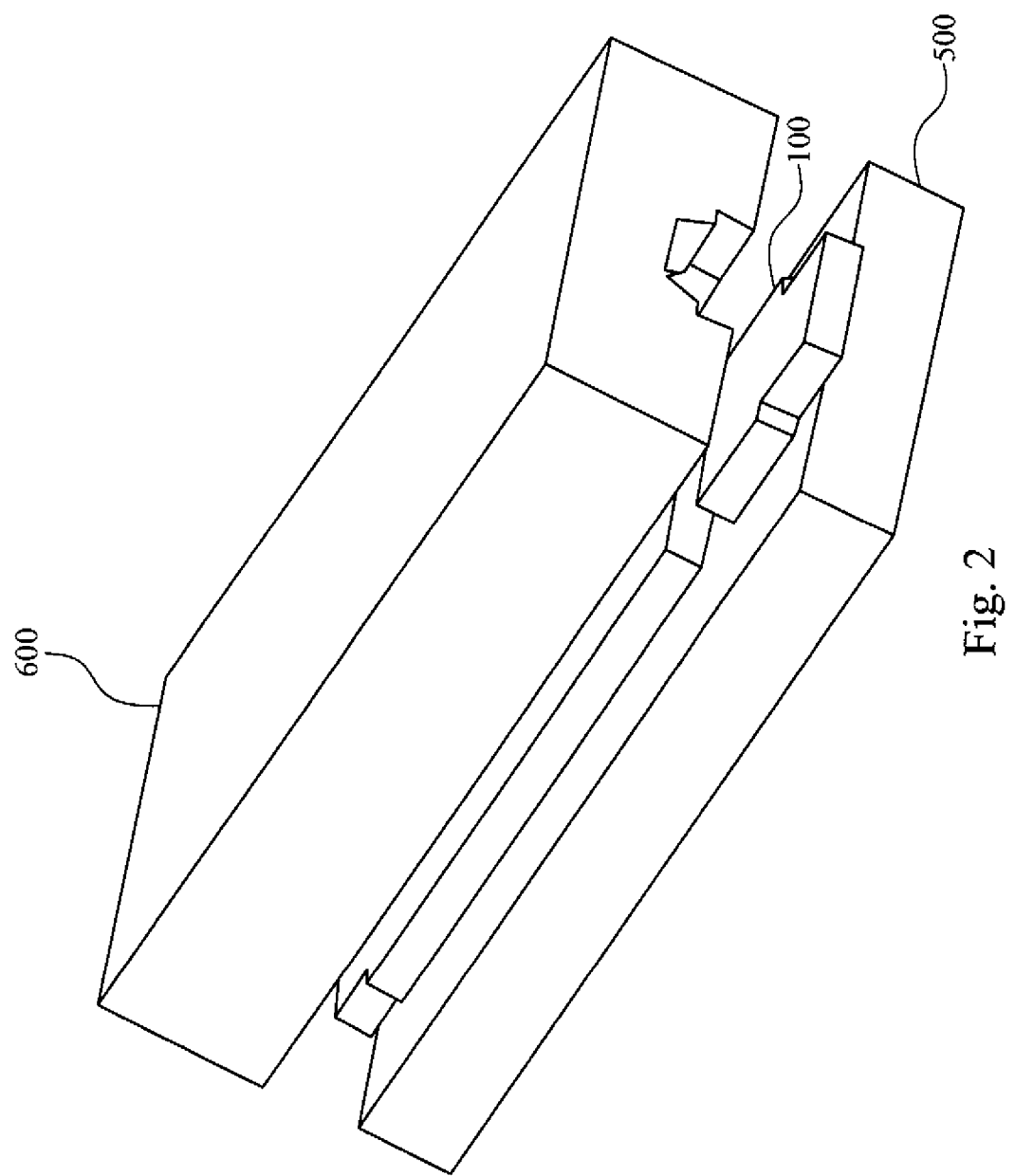
FIG. 2 is an explosive view of a mold for manufacturing the LED mounting substrate in FIG. 1.
Figure 3:
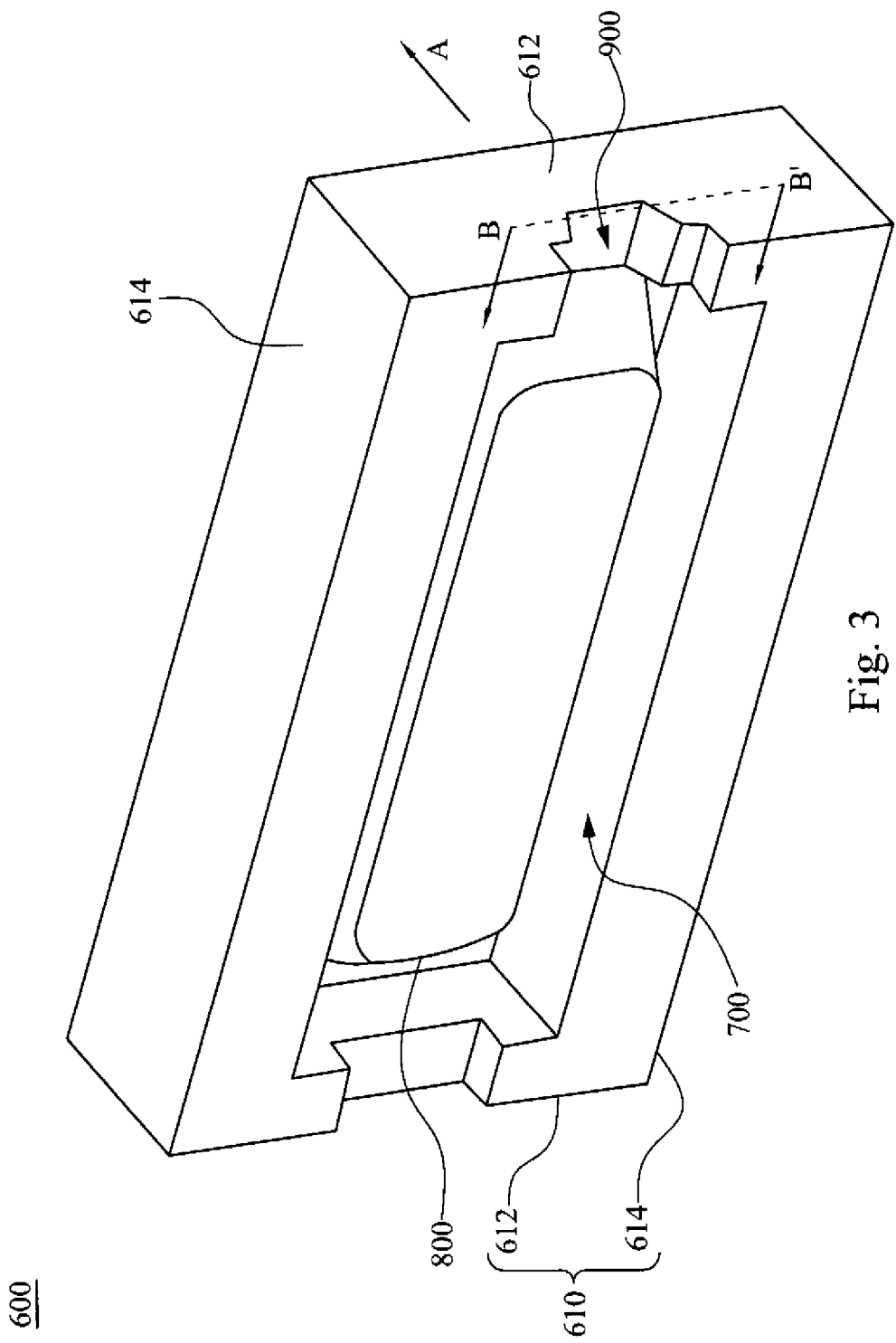
FIG. 3 is a perspective view of the second molding die in FIG. 2.

FIG. 2 is an explosive view of a mold for manufacturing the LED mounting substrate 10 in FIG. 1. As shown in FIG. 2, the mold includes a first molding die 500 and a second molding die 600. The second molding die 600 covers the first molding die 500. The lead frame 100 is placed on the first molding die 500. FIG. 3 is a perspective view of the second molding die 600 in FIG. 2. The second molding die 600 includes a material holding tank 700, a pressing part 800 and a material inlet channel 900. The pressing part 800 is protruded on the material holding tank 700. The volume of pressing part 800 expands along a direction from the first molding die 500 (See FIG. 2) to the second molding die 600 (See FIG. 3). In particular, the width of the pressing part 800 increases along the direction toward the top surface of the second molding die 600. The second molding die 600 has a plurality of outer walls 610. The material inlet channel 900 is connected between one of the outer walls 610 and the material holding tank 700. The material inlet channel 900 shrinks along a direction from the first molding die 500 (See FIG. 2) to the second molding die 600 (See FIG. 3).

Referring to FIGS. 1 to 3, during the process for manufacturing the LED mounting substrate 10, the second molding die 600 can cover the first molding die 500, so as to allow the pressing part 800 to press a portion of the lead frame 100. Then, the material can be injected into the material holding tank 700 through the material inlet channel 900. After the material is cured, the first molding die 500 and the second molding die 600 can be removed, and then, the LED mounting substrate 10 as shown in FIG. 1 can be formed.

The base 200 is formed by the material injected into the material holding tank 700, and therefore, the shape and size of the base 200 are identical to which of the material holding tank 700. The pressing part 800 blocks the material from flowing therethrough, so as to form the cavity 300 without any material on the base 200. Hence, the shape and size of the cavity 300 on the base 200 are identical to which of the pressing part 800. Moreover, when the material is injected into the material holding tank 700 through the material inlet channel 900, some material remains on the material inlet channel 900, and therefore, the residue of injection molding material 400 can be formed by the cured remained material. As such, the shape and size of the cross section of the residue of injection molding material 400 are identical to which of the material inlet channel 900.

Because the pressing part 800 shown in FIG. 2 or 3 expands upwardly, the material required for the base 200 or the material holding tank 700 decreases upwardly. Further, because the cross-sectional area of the material inlet channel 900 decreases upwardly, the material inlet channel 900 allows less material to flow toward the upper portion of the material holding tank 700, and allows more material to flow toward the lower portion of the material holding tank 700. As such, the material inlet channel 900 allows the material to uniformly flow to various positions of the material holding tank 700, thereby forming the base 200 having good structure strength.

The outer wall 610 of the second molding die 600 includes two opposite long walls 614 and two opposite short walls 612. The short walls 612 are adjoined to the long walls 614. In this embodiment, the material inlet channel 900 is positioned on one of the short walls 612. Therefore, the base 200 formed by the second molding die 600 is in the shape as shown in FIG. 1, in which the outer wall 220 of the base 200 includes two opposite long walls 224 and two opposite short walls 222. The short walls 222 are adjoined to the long walls 224. In this embodiment, the residue of injection molding material 400 is disposed on one of the short walls 222.

Figure 4:
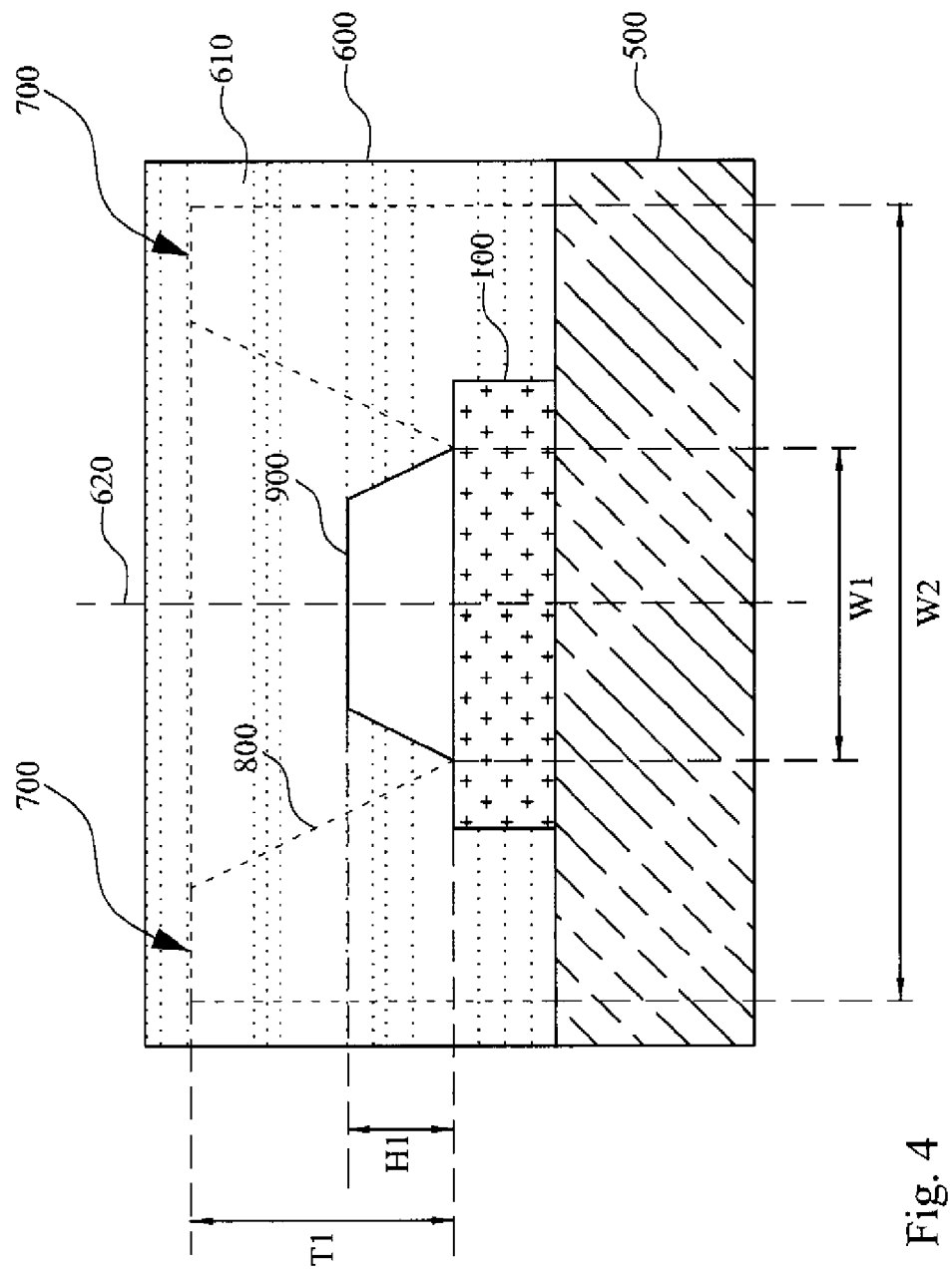
FIG. 4 is a side view of the assembled mold in FIG. 2.

FIG. 4 is a side view of the assembled mold in FIG. 2. As shown in FIG. 4, the cross section of the pressing part 800 and the cross section of the material inlet channel 900 are both symmetrical about a central line 620 of the outer wall 610 where the material inlet channel 900 is located. In this embodiment, the material inlet channel 900 is located at the short wall 612. Because the cross section of the material inlet channel 900 is symmetrical about the central line 620 of the outer wall 610 where the material inlet channel 900 is located, the material can be uniformly injected into the portion of the material holding tank 700 on the left side of the pressing part 800 and the portion of the material holding tank 700 on the right side of the pressing part 800, so as to improve the structure strength of the base 200 shown in FIG. 1.

Figure 5:
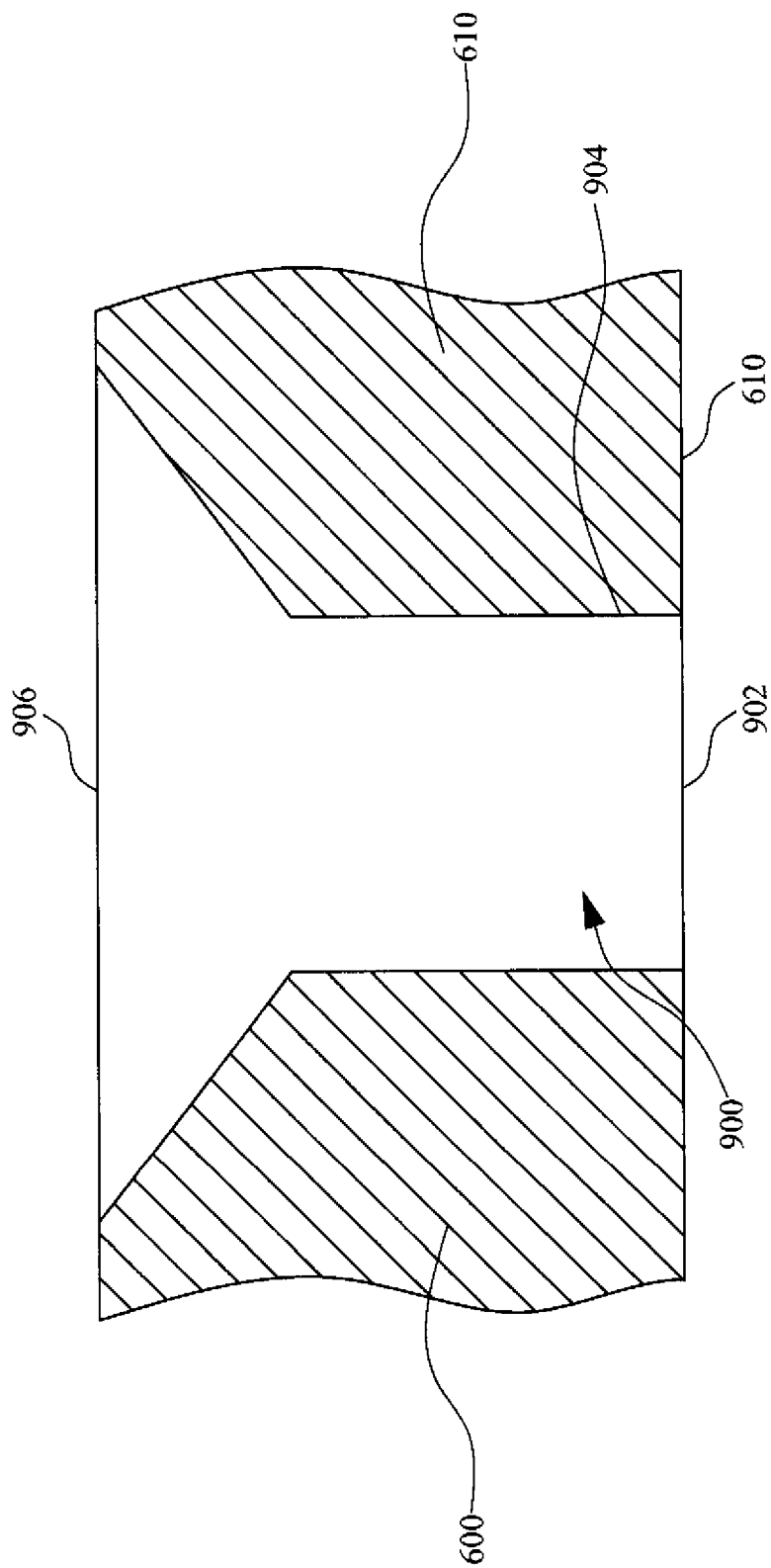
FIG. 5 is a cross-sectional view of the material inlet channel taken along B-B' line in FIG. 3.

FIG. 5 is a cross-sectional view of the material inlet channel 900 taken along B-B' line in FIG. 3. As shown in FIG. 5, the material inlet channel 900 includes an outer opening 902, an inner opening 906 and a passage 904. The outer opening 902 is positioned at the surface of the second molding die 600 for allowing a material from a material supply (not shown) to get into the second molding die 600. The outer opening 902 is positioned on the outer wall 610 of the second molding die 600. The inner opening 906 is positioned inside the second molding die 600 and connected to the material holding tank 700 (See FIG. 3), so as to allow the material enter the second molding die 600 to get into the material holding tank 700. The passage 904 connects the inner opening 906 and the outer opening 902. The cross-sectional area of the inner opening 906 is greater than the cross-sectional area of the outer opening 902, and the passage 904 expands along a direction from the outer opening 902 to the inner opening 906. In other words, the passage 904 expands toward the material holding tank 700, so as to facilitate the material to inject into the portions of the material holding tank 700 on opposite sides of the pressing part 800. The passage 904 is symmetrical about the central line 620 of the short wall 612 (See FIG. 4), so as to facilitate the material to inject into the material holding tank 700 symmetrical about the pressing part 800.

In this embodiment, the cross section of the residue of injection molding material 400 has a width W3, and the outer wall 220 of the base 200 has a width W4. The width W3 is less than or equal to a half of the width W4. In other words, the width of the cross section of the residue of injection molding material 400 is at most half of the width W4 of the outer wall 220.

In this embodiment, the bottom surface 402 of the residue of injection molding material 400 and the top surface 110 of the lead frame 110 are at the same level. In particular, the residue of injection molding material 400 can be in direct contact with the portion of the lead frame 110 that is positioned outside the base 200. Moreover, the cross section of the residue of injection molding material 400 has a height H2, and the cavity 300 has a thickness T2. The height H2 of the cross section of the residue of injection molding material 400 is less than or equal to half of the thickness T2 of the cavity 300. In other words, the height H2 of the cross section of the residue of injection molding material 400 is at most half of the thickness T2 of the cavity 300.

Figure 7:
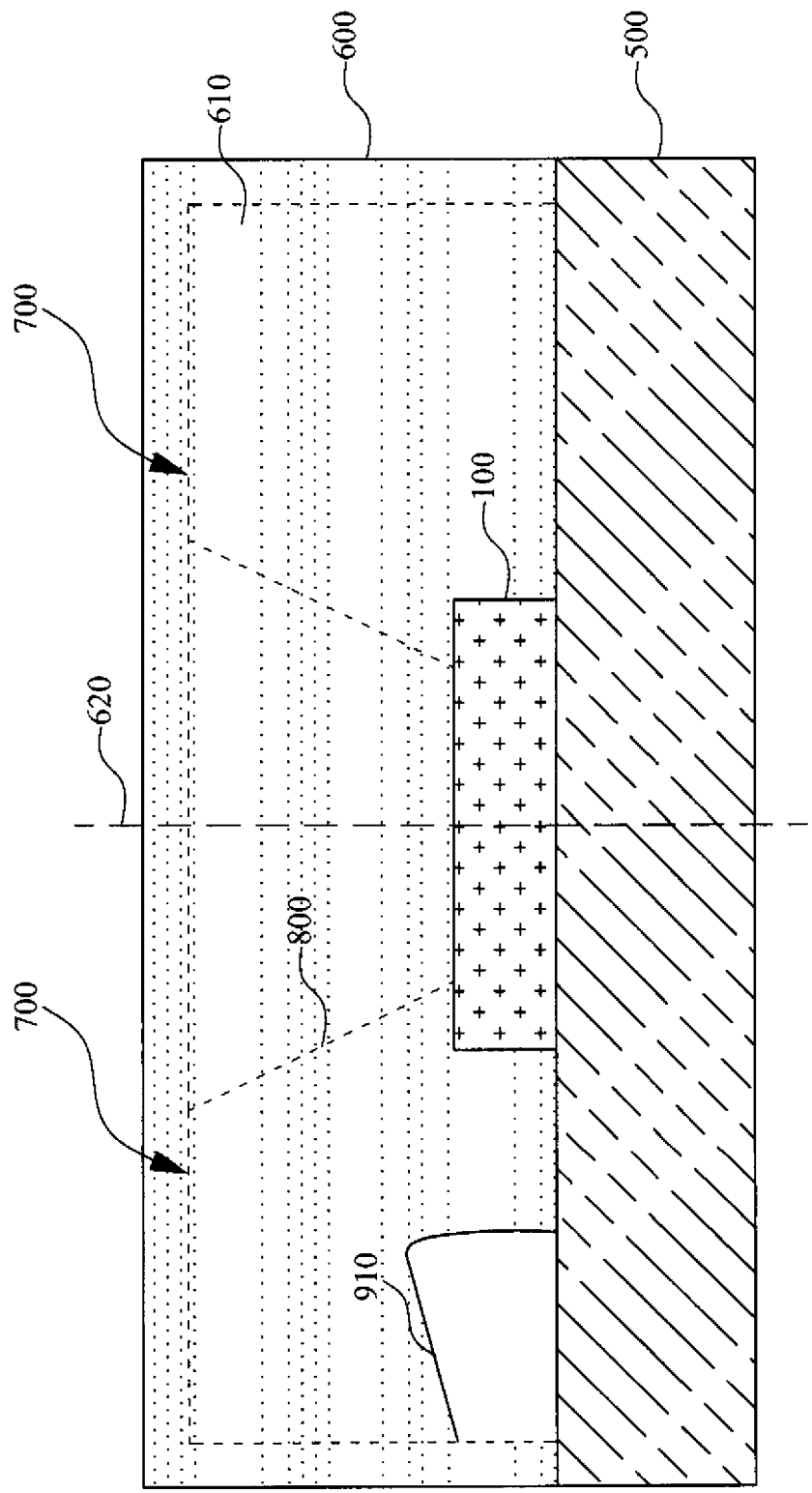
FIG. 7 is a side view of the assembled mold in accordance with another embodiment of the present disclosure.

FIG. 7 is a side view of the assembled mold in accordance with another embodiment of the present disclosure. In this embodiment, the cross section of the material inlet channel 910 is positioned outside the central line 620 of the outer wall 610 that the material inlet channel 910 is connected to. In other words, the central line 620 of the outer wall 610 that the material inlet channel 910 is connected to does not cross the material inlet channel 910. Further, the cross section of the material inlet channel 910 is asymmetrical. In particular, the height of the cross section of the material inlet channel 910 decreases along a direction away from the central line 620 of the outer wall 610 that the material inlet channel 910 is connected to. In other words, the height of the cross section of the material inlet channel 910 increases along a direction toward the central line 620 of the outer wall 610 that the material inlet channel 910 is connected to. As such, even though the material inlet channel 910 deviates from the central line 620, such as the material inlet channel 910 being positioned on the left side of the central line 620, the material can be uniformly injected into the material holding tank 700 by the varied height of the cross section of the material inlet channel 910. In this embodiment, the pressing part Reference is now made to FIG. 4. in this embodiment, the cross section of the material inlet channel 900 has a width W1, and the outer wall 610 of the second molding die 600 has a width W2. The width W1 is the greatest distance between opposite sides of the cross section of the material inlet channel 900. The width W2 is the greatest distance between opposite inner surfaces of the short walls 612. The width W1 of the cross section of the material inlet channel 900 is less than or equal to half of the width W2 of the short wall 612 of the second molding die 600. In other words, the maximum of the width W1 of the cross section of the material inlet channel 900 is half of the width W2 of the short wall 612.

In this embodiment, the material inlet channel 900 and the bottom surface of the pressing part 800 are at the same level. Moreover, the cross section of the material inlet channel 900 has a height H1, and the pressing part 800 has a thickness T1. The height H1 of the cross section of the material inlet channel 900 is less than or equal to half of the thickness T1 of the pressing part 800. In other words, the height H1 of the cross section of the material inlet channel 900 is at most half of the thickness T1 of the pressing part 800.

Figure 6:
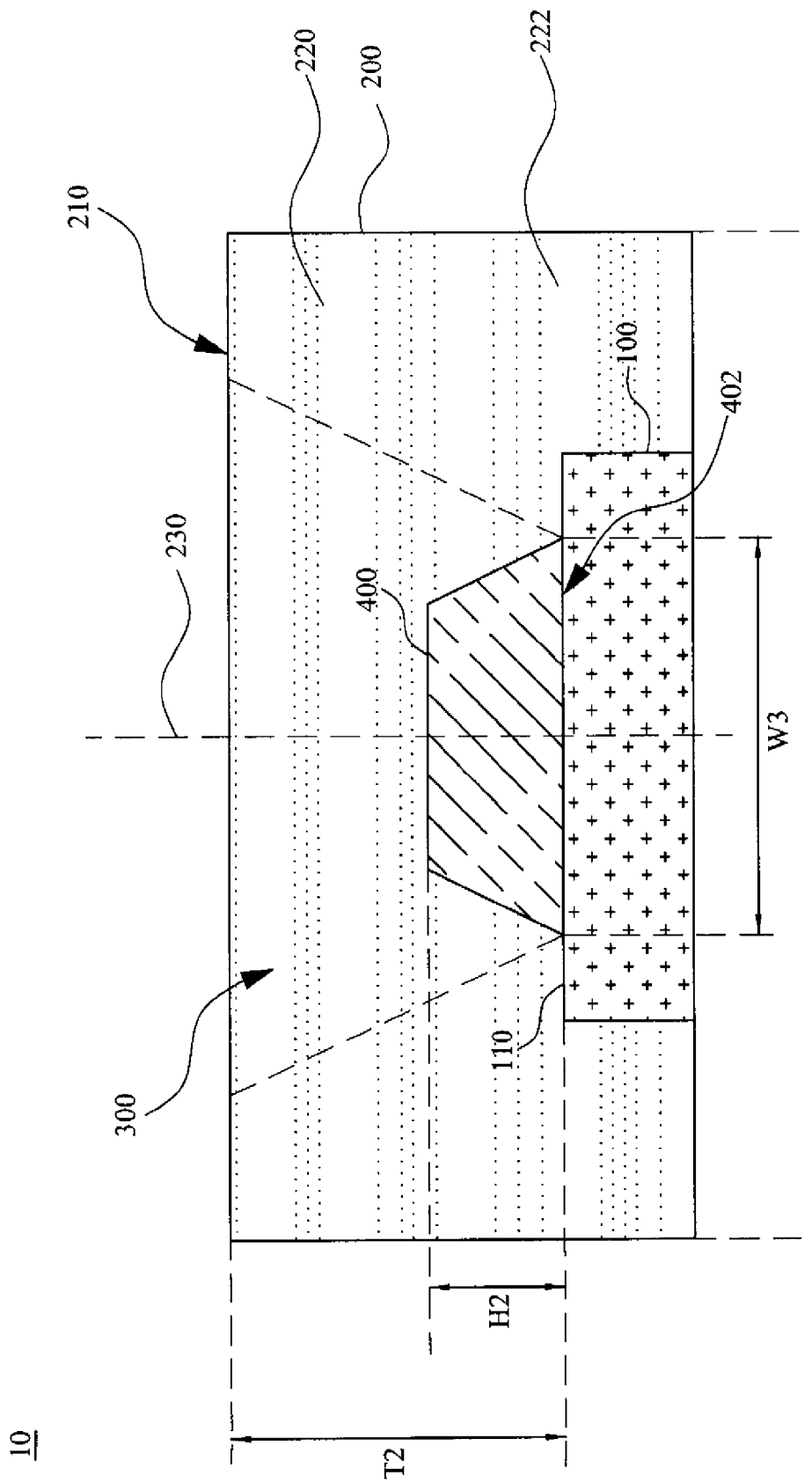
FIG. 6 is a side view of the LED mounting substrate in FIG. 1.

FIG. 6 is a side view of the LED mounting substrate 10 in FIG. 1. Because the material inlet channel 900 (See FIG. 4) is symmetrical, the cross section of the residue of injection molding material 400 is symmetrical about the central line 230 of the outer wall 220 that the residue of injection molding material 400 is disposed on. Further, because the pressing part 800 (See FIG. 4) is symmetrical, the cross section of the cavity 300 is symmetrical about the central line 230 of the outer wall 220 that the residue of injection molding material 400 is disposed on as well. In particular, the portion of the residue of injection molding material 400 on the left side of the central line 230 and the portion of the residue of injection molding material 400 on the right side of the central line 230 have the same size and symmetrical shape. Similarly, the portion of the cavity 300 on the left side of the central line 230 and the portion of the cavity 300 on the right side of the central line 230 have the same size and symmetrical shape. 800 is symmetrical about the central line 620 of the outer wall 610 that the material inlet channel 910 is connected to. In order to produce the mold, in other embodiments, the material inlet channel 910 in asymmetrical shape can also be replaced by the symmetrical material inlet channel 900 shown in FIG. 4. In other words, the symmetrical material inlet channel 900 can be positioned outside the central line 620 as well.

Figure 8:
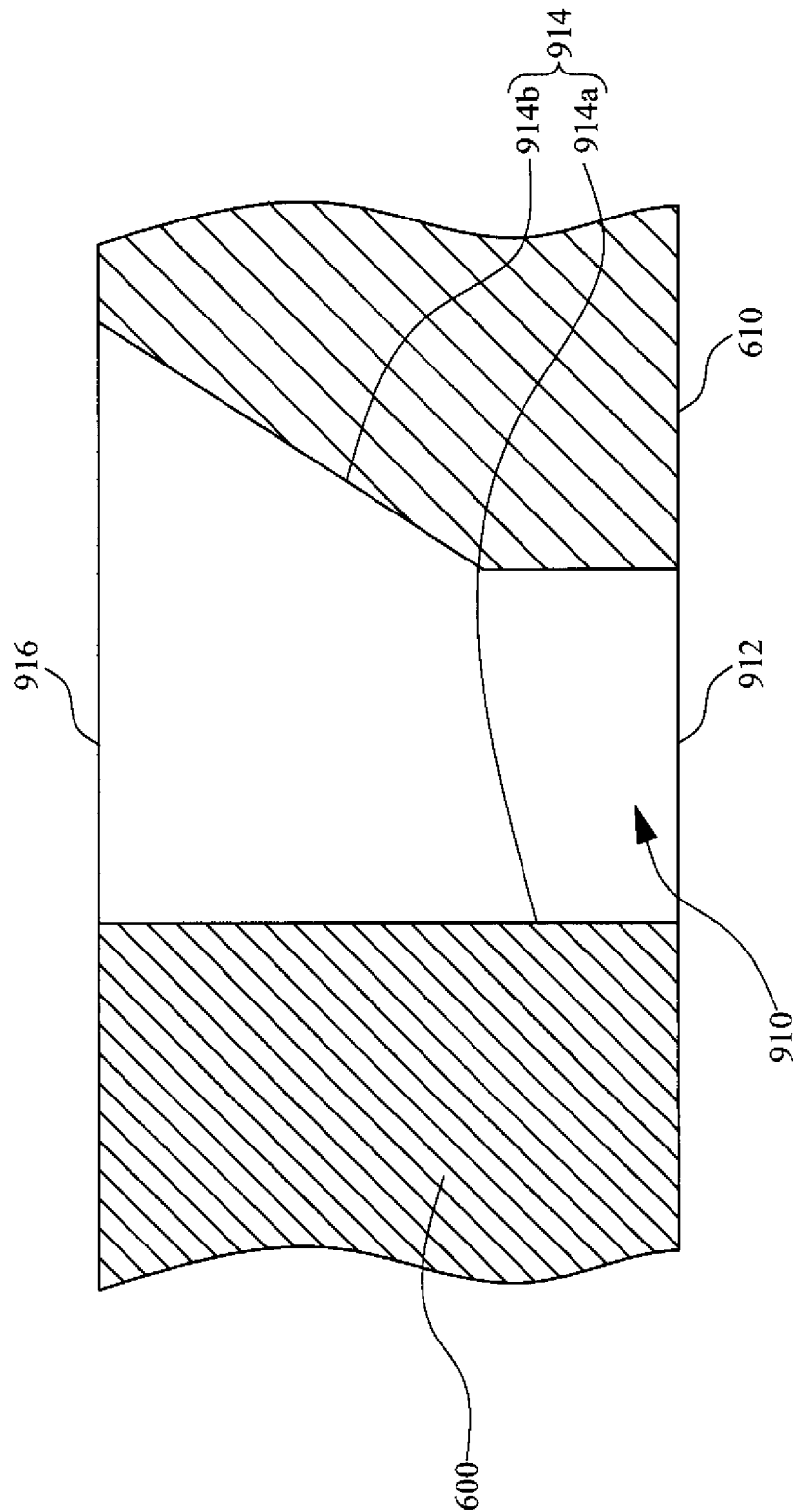
FIG. 8 is a horizontally cross-sectional view of the material inlet channel in FIG. 7.

FIG. 8 is a horizontally cross-sectional view of the material inlet channel 910 in FIG. 7. As shown in FIG. 8, the outer opening 912 is positioned outside the second molding die 600 for allowing a material from a material supply (not shown) to get into the second molding die 600. The inner opening 916 is positioned inside the second molding die 600 and connected to the material holding tank 700 (See FIG. 7), so as to allow the material getting into the second molding die 600 to get into the material holding tank 700. The passage 914 connects the inner opening 916 and the outer opening 912. The cross-sectional area of the inner opening 916 is greater than the cross-sectional area of the outer opening 912, and the passage 914 expands along a direction from the outer opening 912 to the inner opening 916. In other words, the passage 914 expands toward the material holding tank 700, so as to facilitate the material to get into the material holding tank 700 on opposite sides of the pressing part 800.

In this embodiment, the passage 914 is asymmetrical about the central line 620 of the outer wall 610 (See FIG. 7), so as to facilitate the material to get into the material holding tank 700 even though the material inlet channel 910 is positioned outside the central line 620 of the outer wall 610. In particular, the passage 914 includes a first passage wall 914a and a second passage wall 914b. The first passage wall 914a is farer from the central line 620 of the outer wall 610 that the material inlet channel 910 is connected to, and the second passage wall 914b is closer to the central line 620 of the outer wall 610 that the material inlet channel 910 is connected to. The first passage wall 914a is perpendicularly connected between the inner opening 916 and the outer opening 912. The second passage wall 914b is obliquely positioned between the inner opening 916 and the outer opening 912, and the oblique direction of the second passage wall 914b facilitate the material to flow toward the farer portion of the material holding tank 700, such as the portion of the material holding tank 700 on the right side of the pressing part 800 in FIG. 7, so that the material can uniformly flow.

Figure 9:
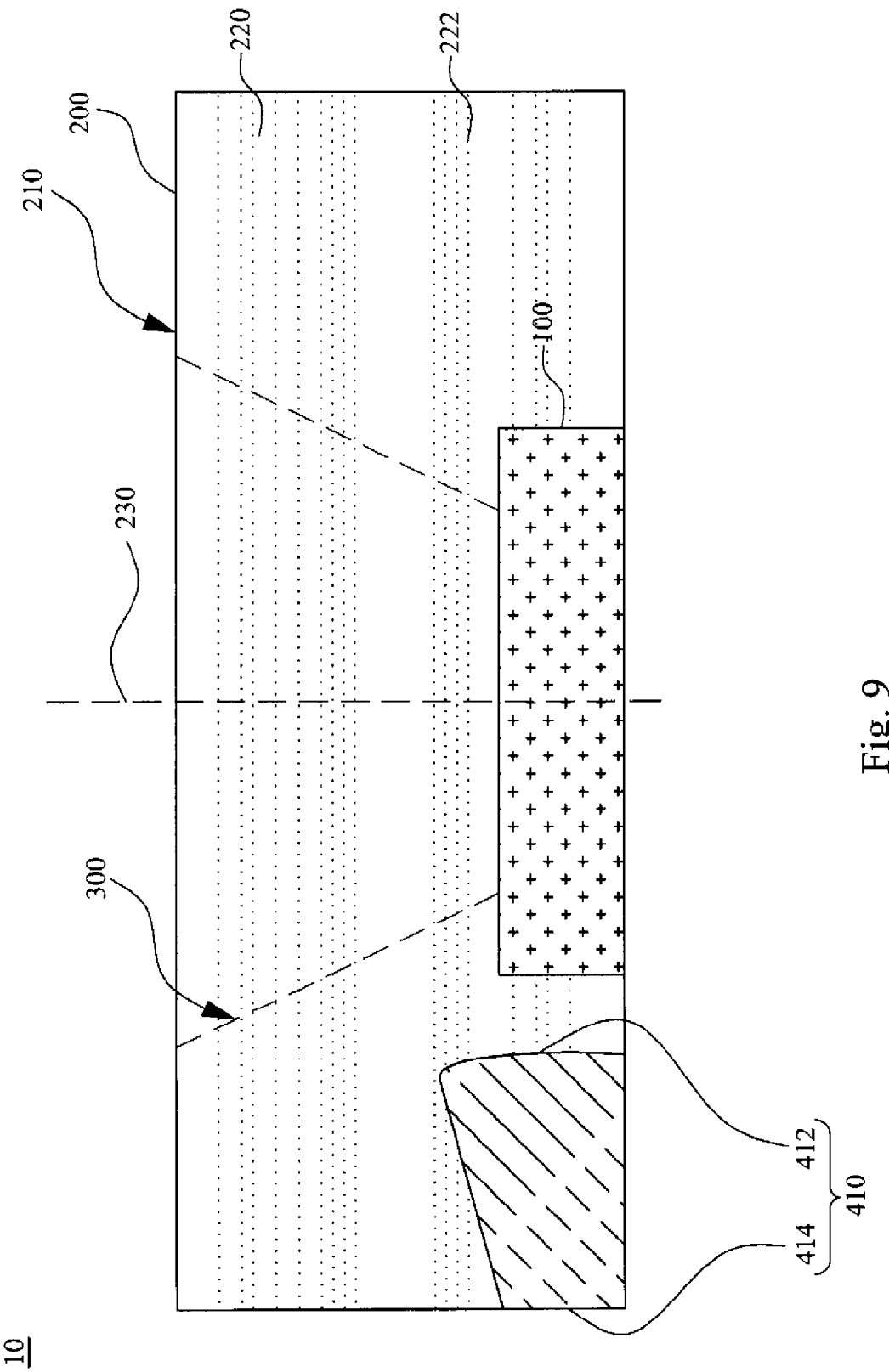
FIG. 9 is a side view of the LED mounting substrate manufactured by the mold in FIG. 7.

FIG. 9 is a side view of the LED mounting substrate 10 manufactured by the mold in FIG. 7. In this embodiment, the cross section of the residue of injection molding material 410 is positioned outside the central line 230 of the outer wall 220 that the residue of injection molding material 410 is disposed on. In other words, the central line 230 of the outer wall 220 that the residue of injection molding material 410 is disposed on does not cross the residue of injection molding material 410. Further, the cross section of the residue of injection molding material 410 is asymmetrical. In particular, the height of the cross section of the residue of injection molding material 410 decreases along a direction away from the central line 230 of the outer wall 220 that the residue of injection molding material 410 is disposed on. In other words, the inner edge 412 of the residue of injection molding material 410 is higher than the outer edge 414 of the residue of injection molding material 410. In this embodiment, the cross section of the cavity 300 is symmetrical to the central line 230 of the outer wall 220 that the residue of injection molding material 410 is disposed on. In order to manufacture the mold, in other embodiment, the residue of injection molding material 410 in asymmetrical shape can be replaced by the symmetrical residue of injection molding material 400 as well. In other words, the symmetrical residue of injection molding material 400 can be positioned outside the central line 230 of the outer wall 220.

Figure 10:
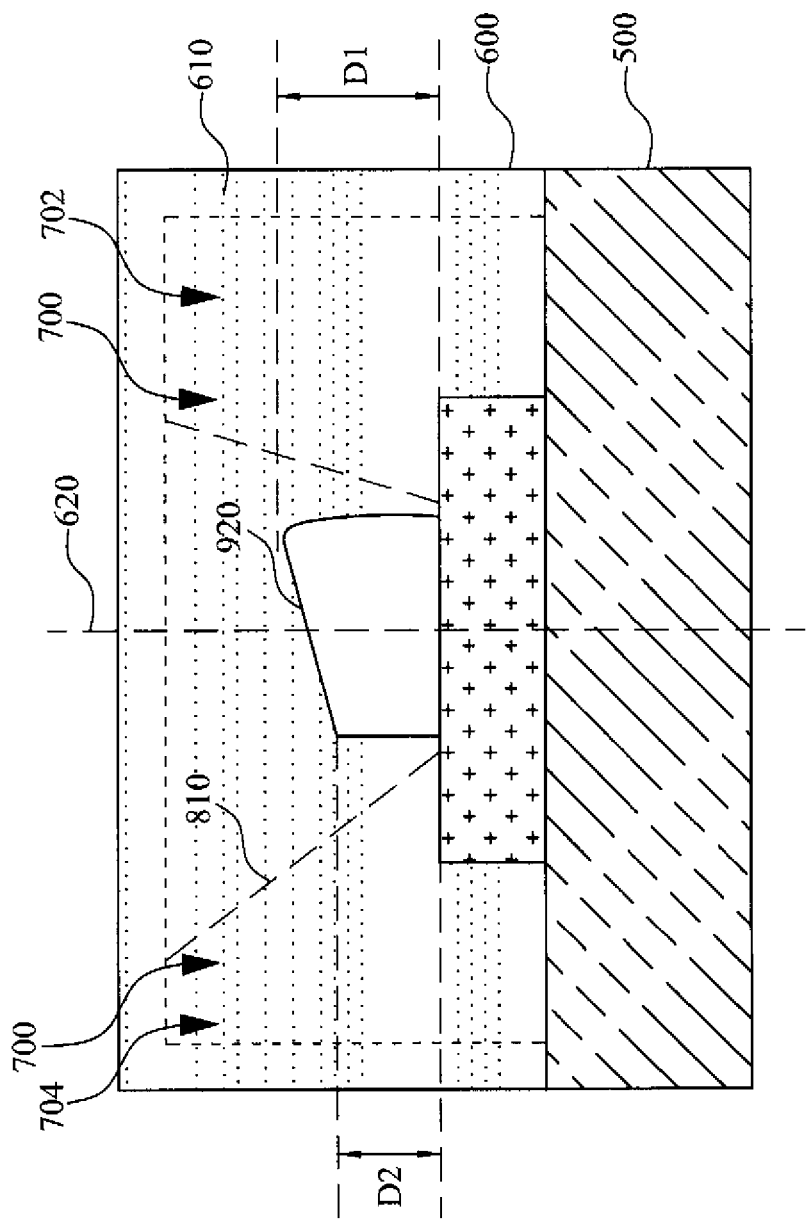
FIG. 10 is a side view of the assembled mold in accordance with another embodiment of the present disclosure.

FIG. 10 is a side view of the assembled mold in accordance with another embodiment of the present disclosure. In this embodiment, the pressing part 810 is asymmetrical about the central line 620 of the outer wall 610 that the material inlet channel 920 is connected to. The central line 620 crosses a cross section of the material inlet channel 920, and the cross section of the material inlet channel 920 is asymmetrical. In particular, in a vertically cross-sectional view, the material holding tank 700 includes a first material holding groove 702 and a second material holding groove 704. The pressing part 810 separates the first material holding groove 702 and the second material holding groove 704. Because the pressing part 810 is asymmetrical, the volume of the first material holding groove 702 is not equal to the volume of the second material holding groove 704. More particularly, the volume of the first material holding groove 702 is greater than the volume of the second material holding groove 704. A height D1 of an edge of a cross section of the material inlet channel 920 that is closer to the first material holding groove 702 is greater than a height D2 of another edge of the cross section of the material inlet channel 920 that is closer to the second material holding groove 704, so as to facilitate to inject more material into the first material holding groove 702 and to inject less material into the second material holding groove 704, such that the material can be uniformly distributed to the first material holding groove 702 and the second material holding groove 704 asymmetrical to each other.

Figure 11:
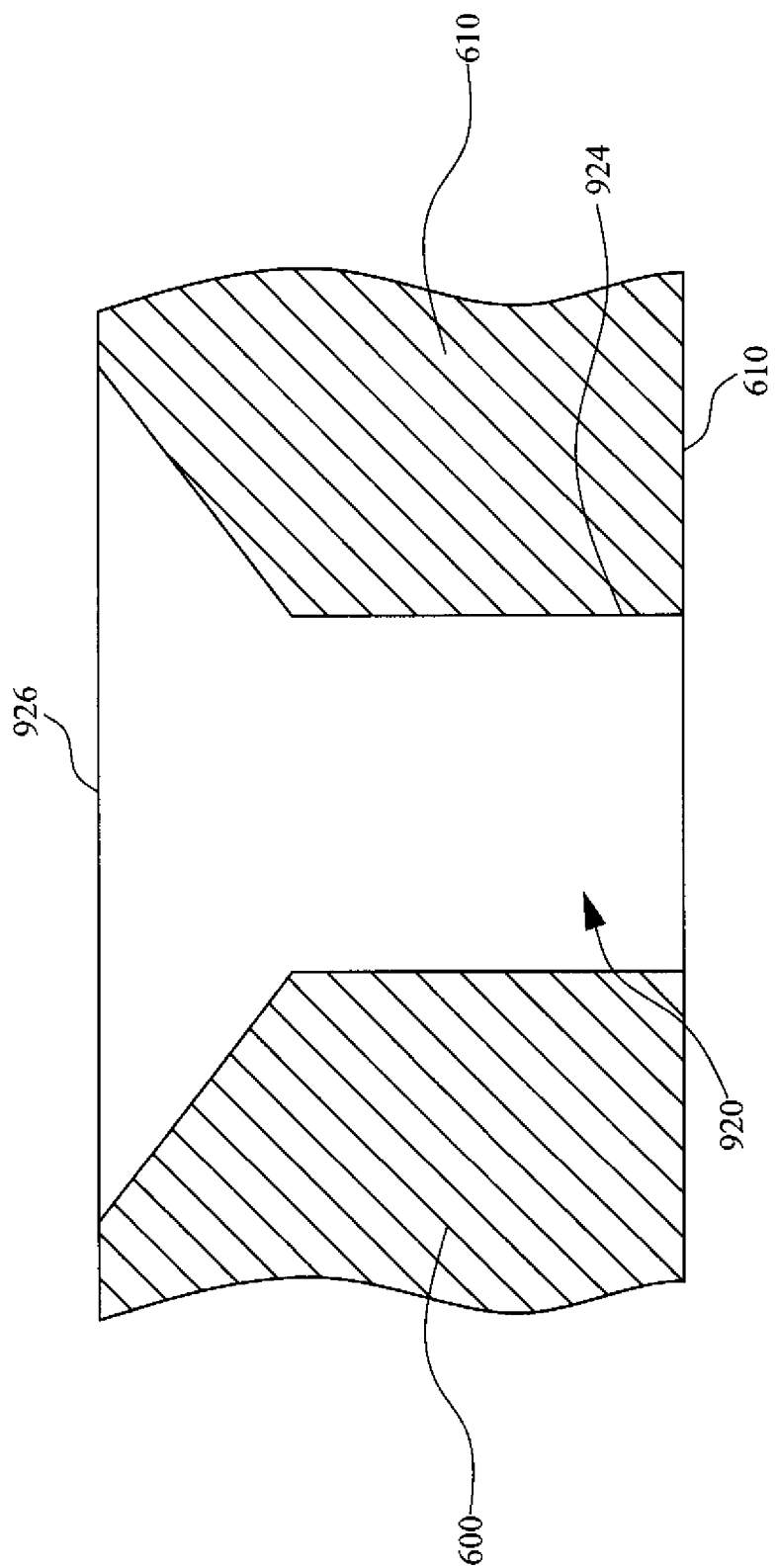
FIG. 11 is a horizontally cross-sectional view of the material inlet channel in FIG. 10.

FIG. 11 is a horizontally cross-sectional view of the material inlet channel 920 in FIG. 10. The outer opening 922 is positioned outside the second molding die 600 for allowing a material from a material supply (not shown) to get into the second molding die 600. The inner opening 926 is positioned inside the second molding die 600 and connected to the material holding tank 700 (See FIG. 10), so as to allow the material getting into the second molding die 600 to get into the material holding tank 700. The passage 924 connects the inner opening 926 and the outer opening 922. The cross-sectional area of the inner opening 926 is greater than the cross-sectional area of the outer opening 922, and the passage 924 expands along a direction from the outer opening 922 to the inner opening 926. In other words, the passage 924 expands toward the material holding tank 700, so as to facilitate the material to get into the first material holding groove 702 and the second material holding groove 704 (See FIG. 10) on opposite sides of the pressing part 810.

Figure 12:
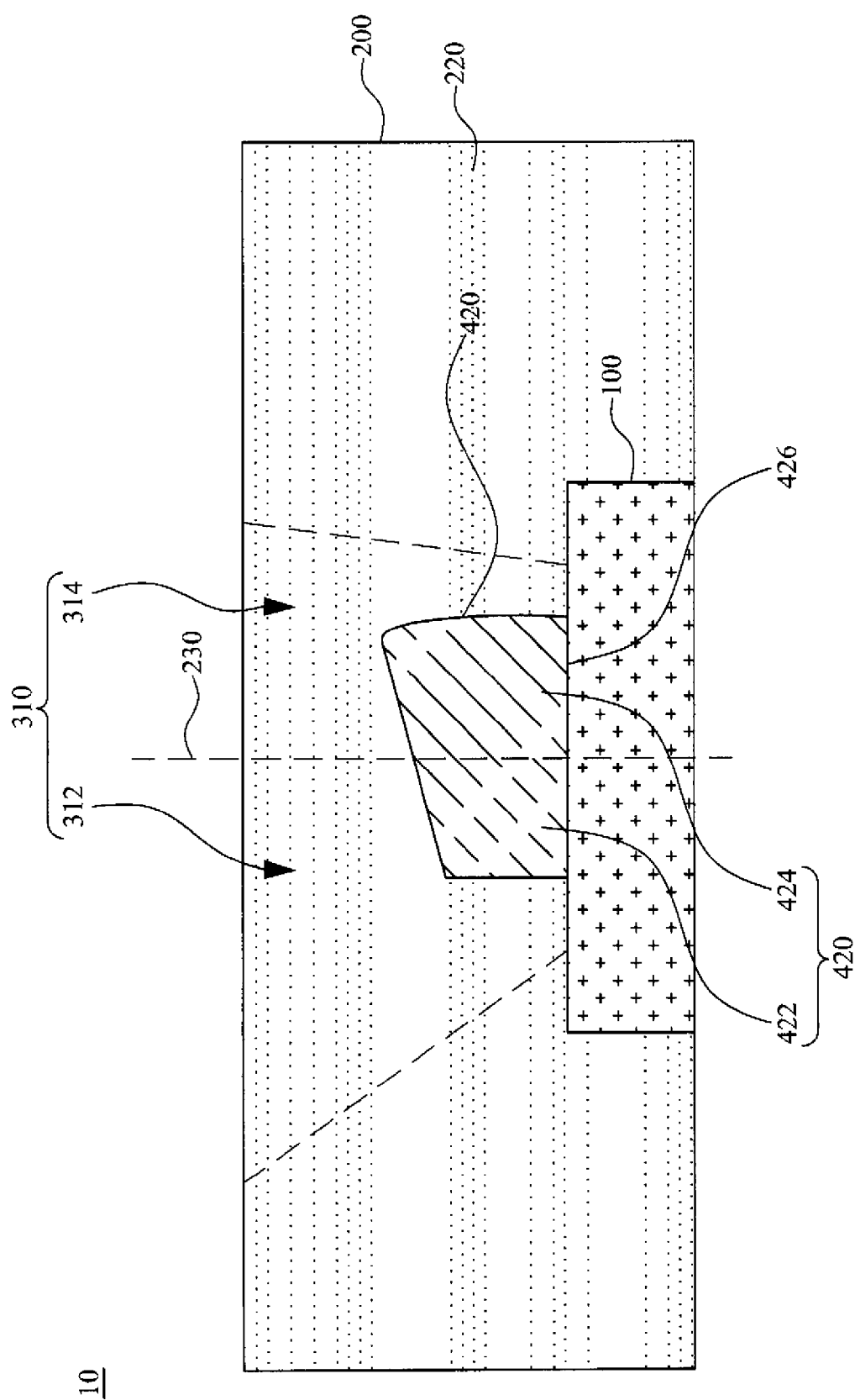
FIG. 12 is a side view of the LED mounting substrate manufactured by the mold in FIG. 11.

FIG. 12 is a side view of the LED mounting substrate 10 manufactured by the mold in FIG. 11. In this embodiment, the cross section of the cavity 310 is asymmetrical about the central line 230 of the outer wall 220 that the residue of injection molding material 420 is disposed on. The central line 230 of the outer wall 220 crosses the residue of injection molding material 420, and the cross section of the residue of injection molding material 420 is asymmetrical. In particular, a cross section of the cavity 310 is divided as a first area 312 and a second area 314 by the central line 230 of the outer wall 220 that the residue of injection molding material 420 is disposed on, and a cross section of the residue of injection molding material 420 is divided as a third area 422 and a fourth area 424 by the central line 230 of the outer wall 220 that the residue of injection molding material 420 is disposed on. The first area 312 and the third area 422 are positioned on one side of the central line 230, and the second area 314 and the fourth area 424 are positioned on another side of the central line 230. The first area 312 is greater than the second area 314. The fourth area 424 is greater than the third area 422. Because the fourth area 424 is greater than the third area 422, more material are allowed to form the portion of the base 200 beside the second area 314, and less material are allowed to form the portion of the base 200 beside the first area 312. Moreover, in this embodiment, the bottom edge 426 of the residue of injection molding material 420 is symmetrical about the central line 230 of the outer wall 220 that the residue of injection molding material 420 is disposed on. In particular, the length of the section of the bottom edge 426 on the left side of the central line 230 is equal to the length of the section of the bottom edge 426 on the right side of the central line 230.

Figure 13:
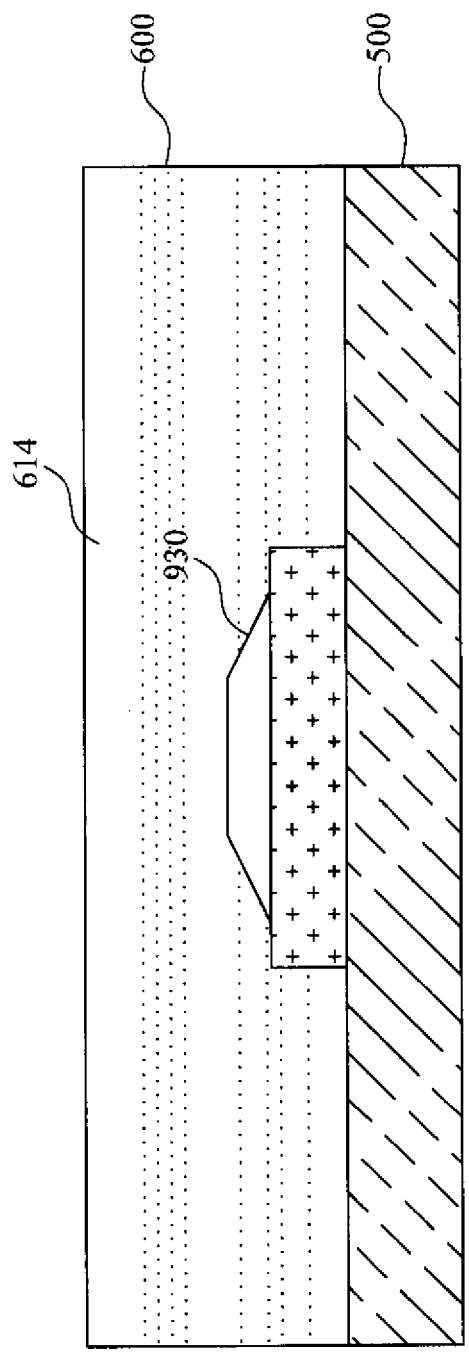
FIG. 13 is a side view of the assembled mold in accordance with another embodiment of the present disclosure.
Figure 14:
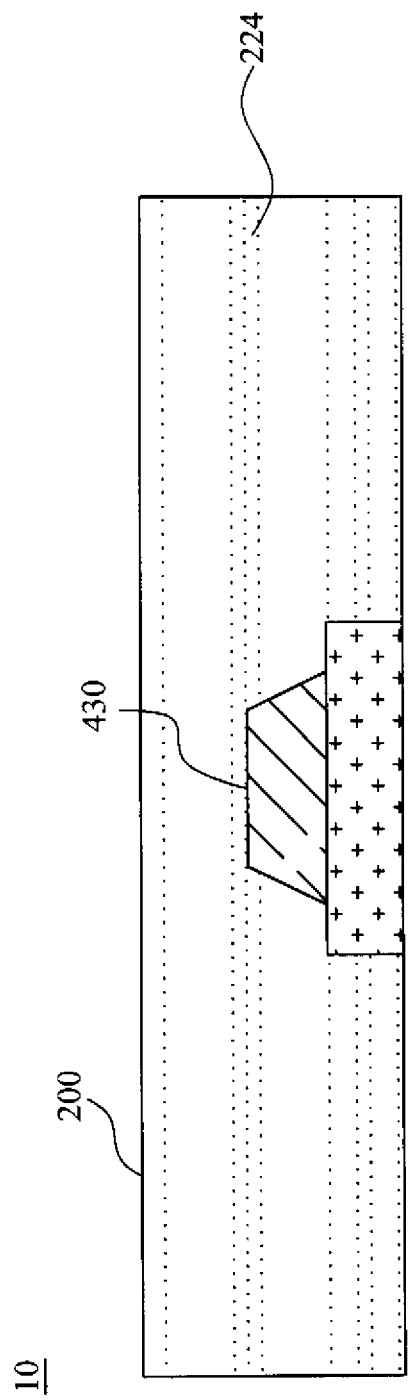
FIG. 14 is a side view of the LED mounting substrate manufactured by the mold in FIG. 13.

FIG. 13 is a side view of the assembled mold in accordance with another embodiment of the present disclosure. The main difference between this embodiment and the foregoing embodiment is that the material inlet channel 930 is positioned on the long wall 614 of the second molding die 600. FIG. 14 is a side view of the LED mounting substrate 10 manufactured by the mold in FIG. 13. Because the material inlet channel 930 is positioned on the long wall 614 of the second molding die 600, as shown in FIG. 13, the residue of injection molding material 430 formed by the material remained in the material inlet channel 930 is disposed on the long wall 224 of the base 200 as well.

Figure 15:
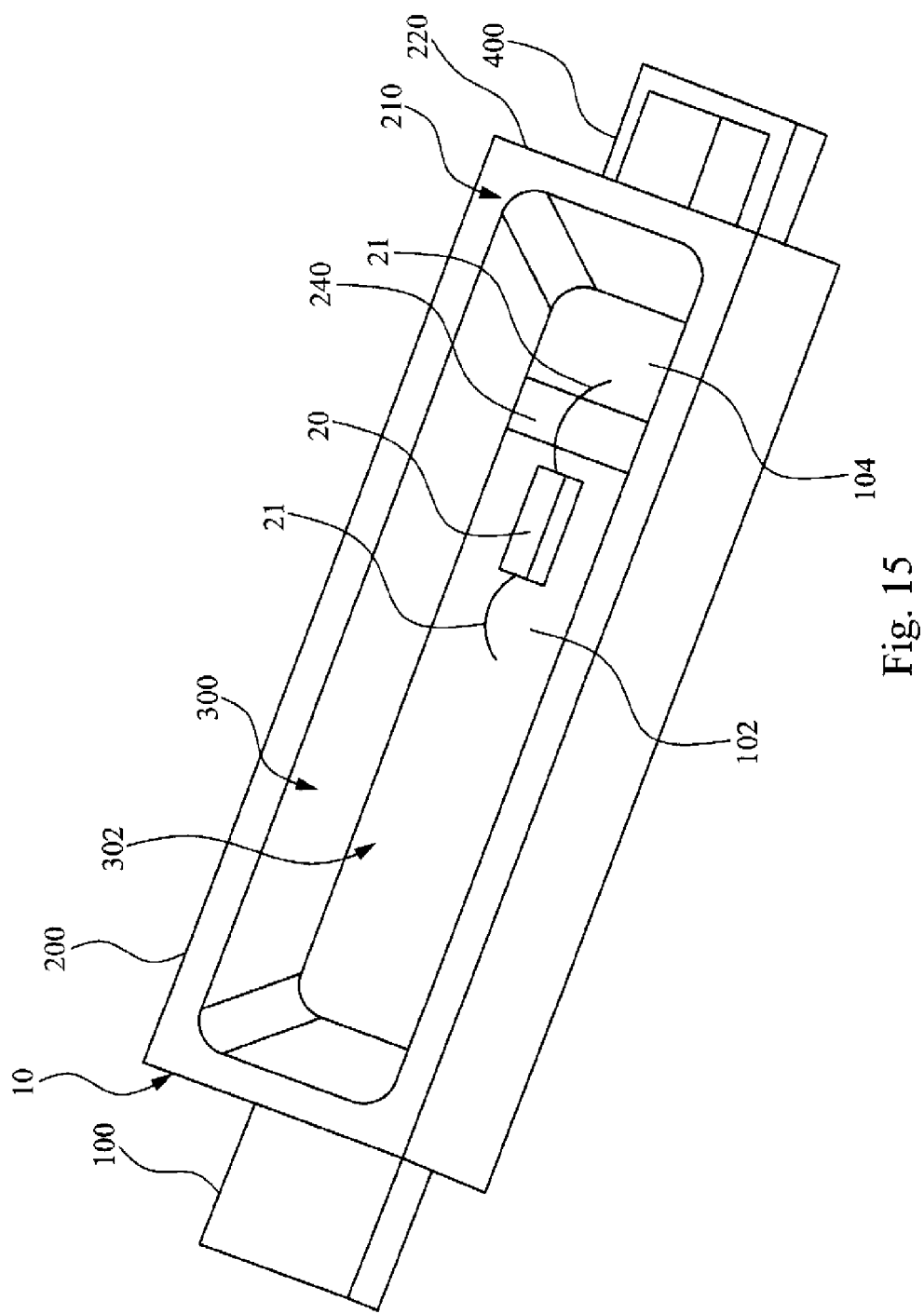
FIG. 15 is a perspective view of the lighting apparatus in accordance with one embodiment of the present disclosure.

FIG. 15 is a perspective view of the lighting apparatus in accordance with one embodiment of the present disclosure. As shown in this figure, the lighting apparatus includes an LED mounting substrate 10 and an LED chip 20. The LED mounting substrate 10 is the same as described in the foregoing embodiments. In particular, in the LED mounting substrate 10, the base 200 is disposed on the lead frame 100. The base 200 has a cavity 300. A bottom of the cavity 300 has an opening 302 for exposing a portion of the lead frame 100. The cross-sectional area of the cavity 300 increases along a direction from the lead frame 100 to the top surface 210 of the base 200. The residue of injection molding material 400 is disposed on one of outer walls 220 of the base 200. The cross-sectional area of the residue of injection molding material 400 decreases along a direction from the lead frame 100 to the top surface 210 of the base 200. The LED chip 20 is accommodated in the cavity 300 of the LED mounting substrate 10 and is disposed on the portion of the lead frame 100 exposed in the cavity 300.

Further, the LED chip 20 can be connected to the lead frame 100 via two connection wires 21, so as to allow the electrical connection between the LED chip 20 and the lead frame 100. The lead frame 100 includes a first frame 102 and a second frame 104. The LED chip 20 is disposed on the first frame 102. The first frame 102 and the second frame 104 are separated by the insulated seat 240, so that the first frame 102 and the second frame 104 can be insulated from each other. The insulated seat 240 and the base 200 are both formed by the thermosetting material through the transfer molding process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An LED mounting substrate, comprising:
    a lead frame;
    a base disposed on the lead frame and having a cavity, a bottom of the cavity having an opening for exposing a portion of the lead frame, a cross-sectional area of the cavity increasing along a direction from the lead frame to a top surface of the base; and
    a residue of injection molding material disposed on one of outer walls of the base surrounding the cavity, a cross-sectional area of the residue of injection molding material decreasing along a direction from the lead frame to the top surface of the base,
    wherein a cross section of the cavity is asymmetrical about a central line of the outer wall that the residue of injection molding material is disposed on, and the central line crosses the residue of injection molding material, and a cross section of the residue of injection molding material is asymmetrical,
    wherein a cross section of the cavity is divided as a first area and a second area by the central line of the outer wall that the residue of injection molding material is disposed on, and a cross section of the residue of injection molding material is divided as a third area and a fourth area by the central line of the outer wall that the residue of injection molding material is disposed on, wherein the first area and the third area are positioned on one side of the central line, and the second area and the fourth area are positioned on another side of the central line, wherein the first area is greater than the second area, and the fourth area is greater than the third area.

2. The LED mounting substrate of claim 1, wherein a cross section of the cavity and a cross section of the residue of injection molding material are both symmetrical about a central line of the outer wall that the residue of injection molding material is disposed on.

3. The LED mounting substrate of claim 1, wherein a cross section of the cavity is symmetrical about a central line of the outer wall that the residue of injection molding material is disposed on, and a cross section of the residue of injection molding material is positioned outside the central line, and the cross section of the residue of injection molding material is asymmetrical.

4. The LED mounting substrate of claim 3, wherein a height of the cross section of the residue of injection molding material decreases along a direction away from the central line of the outer wall that the residue of injection molding material is disposed on.

5. The LED mounting substrate of claim 1, wherein a bottom edge of the residue of injection molding material is symmetrical about the central line of the outer wall where the residue of injection molding material is located.

6. The LED mounting substrate of claim 1, wherein a width of a cross section of the residue of injection molding material is less than or equal to a half of a width of the outer wall where the residue of injection molding material is located.

7. The LED mounting substrate of claim 1, wherein a bottom surface of the residue of injection molding material and a top surface of the lead frame are positioned at the same level, and a height of the residue of injection molding material is less than or equal to a half of a thickness of the cavity.

8. The LED mounting substrate of claim 1, wherein the outer walls comprises:
    two opposite long walls; and
    two opposite short walls adjoined to the long walls;
    wherein the residue of injection molding material is disposed on one of the short walls or one of the long walls.

9. A lighting apparatus, comprising:
    an LED mounting substrate of claim 1;
    an LED chip accommodated in the cavity of the LED mounting substrate and disposed on the portion of the lead frame of the LED mounting substrate exposed in the cavity.

* * * * *